United States Patent [19]

Stewart

[11] Patent Number: 5,641,358

[45] Date of Patent: Jun. 24, 1997

[54] MODULAR PARYLENE DEPOSITION APPARATUS HAVING VAPOR DEPOSITION CHAMBER EXTENSION

[76] Inventor: Jeffrey Stewart, 690-D Avenida Sevilla, Laguna Hills, Calif. 92653

[21] Appl. No.: 541,402

[22] Filed: Oct. 10, 1995

[51] Int. Cl.$^6$ .................................................. C23C 16/00
[52] U.S. Cl. ........................ 118/715; 118/733; 118/50
[58] Field of Search ............................... 118/715, 733, 118/50

[56] References Cited

U.S. PATENT DOCUMENTS

| 3,491,720 | 1/1970 | Harris | 118/719 |
|---|---|---|---|
| 5,078,091 | 1/1992 | Stewart | 118/719 |
| 5,368,648 | 11/1994 | Sekizuka | 118/733 |
| 5,497,727 | 3/1996 | Mayeda | 118/733 |
| 5,534,068 | 7/1996 | Beach | 118/719 |

FOREIGN PATENT DOCUMENTS

| 60-115219 | 6/1985 | Japan | 118/733 |
| 2-111693 | 4/1990 | Japan | 118/733 |

*Primary Examiner*—Richard Bueker
*Assistant Examiner*—Jeffrie R. Lund
*Attorney, Agent, or Firm*—Stetina Brunda & Buyan

[57] ABSTRACT

A tank-like deposition chamber for use in depositing vapors on desired substrates. The deposition chamber has top and bottom ends, and includes a floor which defines the bottom end thereof. In addition to the floor, the deposition chamber includes a vertical sidewall having an inner surface and an upper edge, and at least one wall extension member which is releasably attached to the upper edge of the sidewall and has an upper rim which defines the top end of the deposition chamber. The wall extension member, sidewall and floor define an interior compartment. Attached to the sidewall and communicating with the interior compartment is a vapor inlet port and a first vapor outlet port. Additionally, attached to the wall extension member and communicating with the interior compartment is a second vapor outlet port. The wall extension member increases the storage capacity of the deposition chamber when attached to the upper edge of the sidewall.

14 Claims, 2 Drawing Sheets

MODULAR PARYLENE DEPOSITION APPARATUS HAVING VAPOR DEPOSITION CHAMBER EXTENSION

FIELD OF THE INVENTION

The present invention relates generally to a system for depositing condensation coatings on various substrates, and more particularly to an improved modular deposition chamber which includes at least one extension member for selectively increasing the storage capacity thereof.

BACKGROUND OF THE INVENTION

Para-xylylene polymers are employed as coatings for various electronic components due to their desirable physical and electrical properties. One advantage of poly-para-xylylene coatings is that thin layers of such coatings are capable of exhibiting highly desirable physical and electrical properties. Because para-xylylene coatings are applied in very thin layers, heat tends to dissipate rapidly from the underlying components. Thus, the coated components cool down quickly and are less prone to temperature related degradation than similar components bearing other types of coatings.

In further contrast to conventional polymer coatings, para-xylylenes are generally not prepolymerized prior to application on the coatable substrates. This is because the para-xylylene polymers are not given to simple extrusion, melting or molding as are many of the conventional thermoplastics. Additionally, because the para-xylylenes are generally insoluble in commonly used organic solvents, it is impractical to employ traditional solvent deposition techniques for applying poly-para-xylylene coatings.

Accordingly, in most commercial applications, para-xylylene polymers are deposited on desired substrates by a pyrolytic deposition process known specifically as the "parylene process." Such process begins with the vaporization of a cyclic di-para-xylylene dimer. The dimer is pyrolytically cleaved at temperatures of about 400° to 750° C. to form a reactive para-xylylene monomer vapor. Thereafter, the reactive monomer vapor is transferred to a deposition chamber wherein the desired substrates are located. Within the deposition chamber, the reactive monomer vapor condenses upon the desired substrates to form a para-xylylene polymer or copolymer film.

Any monomer vapor which fails to condense within the deposition chamber is subsequently removed by a cold trap which is maintained at approximately −70° C.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

A primary consideration in the parylene deposition process is the achievement of uniform coating thickness on the desired substrates. Unlike conventional polymer coating systems, the condensation deposition of parylene coatings is capable of depositing even ultra-thin films without running or uneven areas resulting upon the substrates, provided that the monomer vapor is homogeneously and evenly distributed on the surface of the substrate. Thus, the design and functioning of the deposition chamber is critical to the achievement of uniform vapor distribution with resultant even coating deposition. Another important consideration in the parylene deposition process is the minimization of waste. Because of the high costs associated with parylene raw materials, there exists substantial economic motivation to preserve and conserve the parylene materials during the coating process.

The parylene deposition process is conducted most efficiently when a relatively large number of substrates are simultaneously coated. However, parylene deposition chambers employed in the prior art are generally deficient in that they are of limited internal volume, and are adapted to accommodate only a relatively small number of substrates. In this respect, these prior art parylene deposition chambers are not configured in a manner allowing the storage capacities thereof to be selectively increased, thereby necessitating that multiple parylene deposition operations be conducted when a large number of substrates must be coated. The present invention overcomes this deficiency associated with prior art deposition chambers by providing a deposition chamber wherein the storage capacity (i.e., internal volume) thereof may be selectively increased by adding one or more extension members thereto.

SUMMARY OF THE INVENTION

In accordance with the present invention, there is provided tank-like deposition chamber for use in depositing vapors on desired substrates. The deposition chamber constructed in accordance with the present invention has top and bottom ends, and comprises a floor which defines the bottom end thereof. In addition to the floor, the deposition chamber comprises a vertical sidewall having an inner surface and an upper edge. Releasably attached to the upper edge of the sidewall is at least one wall extension member having an upper rim which defines the top end of the deposition chamber. The wall extension member, sidewall and floor cumulatively define an interior compartment. Importantly, the attachment of the wall extension member to the sidewall facilitates an increase in the storage capacity (i.e., internal volume) of the deposition chamber. In the preferred embodiment, the sidewall and wall extension member each have generally cylindrical configurations.

Attached to the sidewall of the deposition chamber adjacent the floor is a vapor inlet port which tangentially communicates with the interior compartment. Additionally, attached to the sidewall adjacent the upper edge thereof is a first vapor outlet port which also tangentially communicates with the interior compartment. Attached to the wall extension member adjacent its upper rim is a second vapor outlet port which, like the first vapor outlet port, tangentially communicates with the interior compartment. Advantageously, due to the vapor inlet port tangentially communicating with the interior compartment, vapor entering the interior compartment therethrough will impinge the inner surface of the sidewall in a manner facilitating vapor flow in a generally rotational pattern within the deposition chamber.

Further in accordance with the present invention, the deposition chamber is preferably used in combination with a cold trap which itself comprises a containment vessel having a closed bottom end and an open top end defined by an annular lip. Releasably attached to the annular lip is at least one tubular extension sleeve. The containment vessel and extension sleeve cumulatively define an interior reservoir of the containment vessel. Attached to the containment vessel is a first vapor inlet line which tangentially communicates with the interior reservoir, while attached to the extension sleeve is a second vapor inlet line which also tangentially communicates with the interior reservoir. In the

3 preferred embodiment, the first vapor inlet line is fluidly connectible to the first vapor outlet port of the deposition chamber, with the second vapor inlet line itself being fluidly connected to the second vapor outlet port.

The deposition chamber constructed in accordance with the present invention may alternatively include multiple wall extension members. In this respect, a first wall extension member is attached to the upper edge of the sidewall, with successive wall extension members being attached to the upper rim defined by the preceding wall extension member. Similarly, the cold trap used in combination with the deposition chamber may include multiple extension sleeves, with the first extension sleeve being attached to the annular lip of the containment vessel and successive extension sleeves being attached to the preceding extension sleeve. Importantly, irrespective of the number of wall extension members and extension sleeves included with the deposition chamber and cold trap, the vapor outlet port of the uppermost wall extension member will be fluidly connected to the vapor inlet line of the uppermost extension sleeve, with the vapor outlet ports of the sidewall and any intermediate wall extension members and vapor inlet lines of the containment vessel and any intermediate extension sleeves being effectively blocked.

BRIEF DESCRIPTION OF THE DRAWINGS

These, as well as other features of the present invention, will become more apparent upon reference to the drawings wherein.

DETAILED DESCRIPTION OF THE PREFERRED EMBODIMENTS

Figure 1:
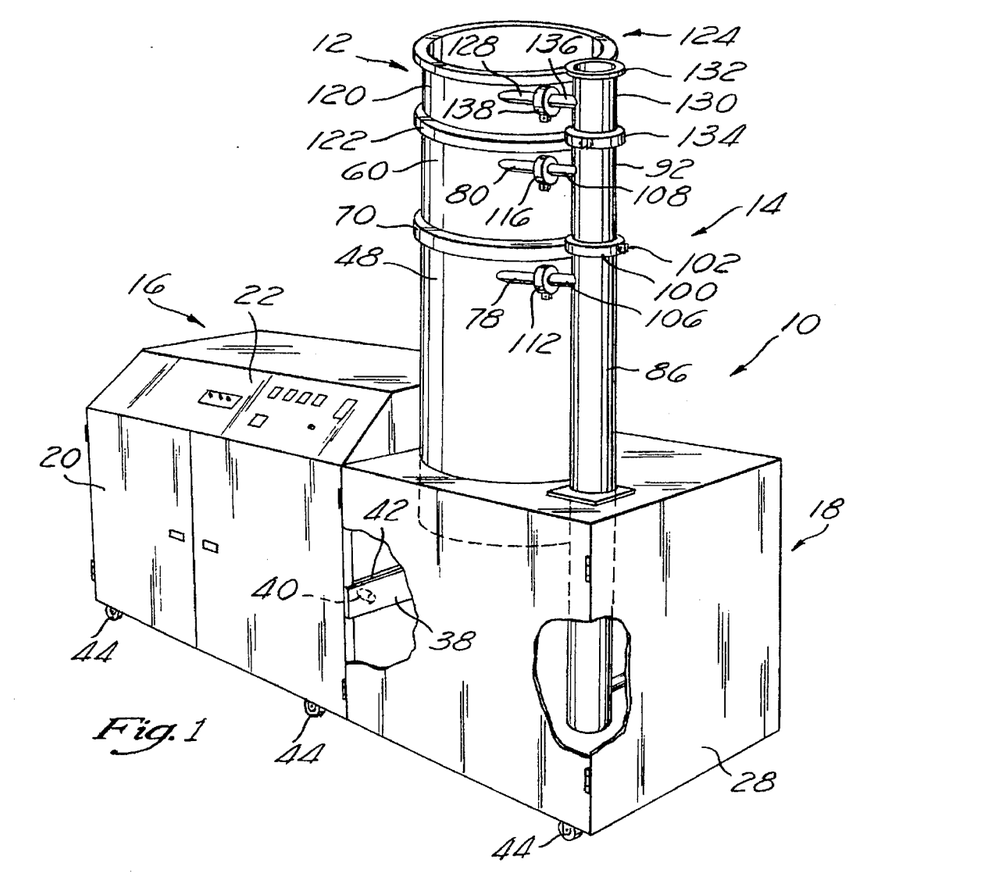
FIG. 1 is a front perspective view of a parylene deposition system incorporating the deposition chamber constructed in accordance with the present invention.
Figure 2:
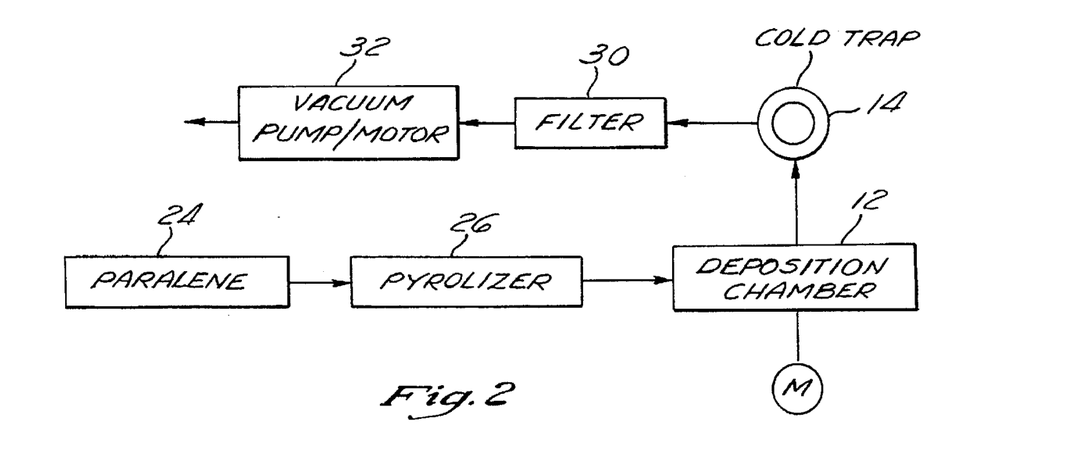
FIG. 2 is a schematic identifying the primary components of the deposition system shown in FIG. 1.

Referring now to the drawings wherein the showings are for purposes of illustrating preferred embodiments of the present invention only, and not for purposes of limiting the same, FIG. 1 perspectively illustrates a parylene deposition system 10 incorporating the novel deposition chamber 12 and accompanying cold trap 14 constructed in accordance with the present invention. Referring now to FIGS. 1 and 2, the deposition system 10 of the present invention is of a modular design, and consists generally of a pyrolytic vapor generating module 16 and an attendant deposition chamber module 18. The pyrolytic vapor generating module 16 comprises a cabinet-like housing 20 including a control panel 22, as shown in FIG. 1.

Disposed within the housing 20 of the vapor generating module 16 is a dimer vaporization chamber 24 into which parylene raw material is inserted via an associated entrance port. The vaporization chamber 24 includes heating elements associated therewith, and provides a zone wherein a quantity of di-para-xylylene dimer is initially vaporized at elevated temperatures. Also disposed within the housing 20 is a pyrolysis chamber or pyrolizer 26 which is fluidly coupled to the vaporization chamber 24 by appropriate tubular connections. The vaporized dimer exits the vaporization chamber 24 and enters the pyrolysis chamber 26 wherein the dimer is pyrolyzed at temperatures of about 400° to 750° C. by heating elements associated with the pyrolysis chamber 26 so as to form the desired para-xylylene monomer vapor. Though not shown, the vapor generating module 26 also houses a controller unit which controls the temperatures, conditions, valves, motors, pumps, etc., of the deposition system 10.

Figure 3:
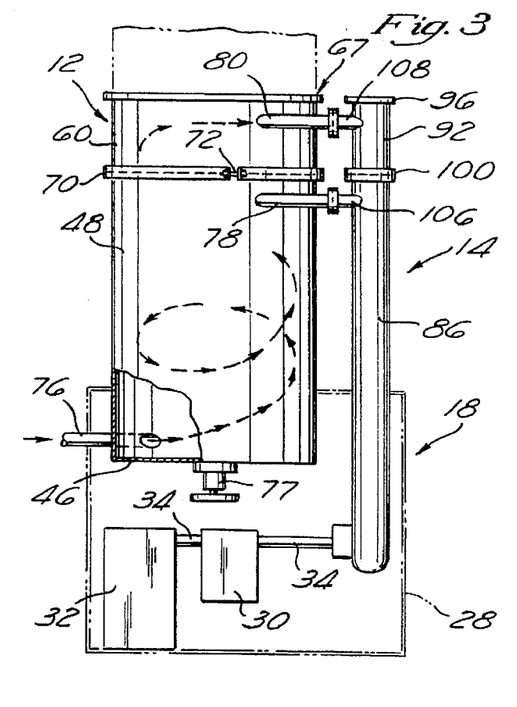
FIG. 3 is a cross-sectional view of the deposition chamber module of the deposition system shown in FIG. 1.

The deposition chamber module 18 of the deposition system 10 itself comprises a base cabinet 28 to which the deposition chamber 12 and cold trap 14 are mounted. As seen in FIG. 3, disposed within the base cabinet 28 is a filter 30 and a vacuum pump 32, both of which are fluidly coupled to the cold trap 14 by appropriate tubular connections 34. Also disposed within the base cabinet 28 is a motor 36 which is used to facilitate the rotation of a substrate support fixture (not shown) normally residing within the interior of the deposition chamber 12.

In the preferred embodiment, the vapor generating module 16 and deposition chamber module 18 of the deposition system 10 are releasably connected to each other. In this respect, attached to the base cabinet 28 of the deposition chamber module 18 is a horizontally extending mounting bar 38 having a pair of cylindrically configured mounting posts 40 extending laterally (i.e., perpendicularly) therefrom. Additionally, attached to the housing 20 of the vapor generating module 16 is a horizontally extending mounting bar 42 which defines a pair of apertures adapted to receive respective ones of the mounting posts 40. The releasable connection of the vapor generating and deposition chamber modules 16, 18 to each other is facilitated by the receipt of the mounting posts 40 into the apertures of the mounting bar 42. To facilitate the transportability of the complete deposition system 10 or the individual vapor generating and deposition chamber modules 16, 18 thereof to different locations, attached to the bottom of the housing 20 and to the bottom of the base cabinet 28 are casters 44.

Figure 4:
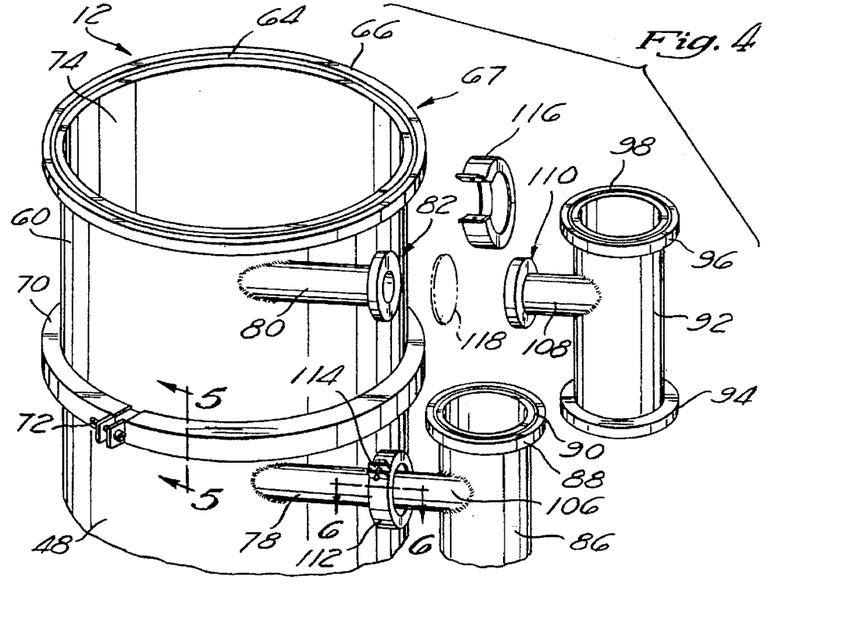
FIG. 4 is an exploded view illustrating the manner in which the deposition chamber is fluidly connected to the cold trap of the parylene deposition system.
Figure 5:
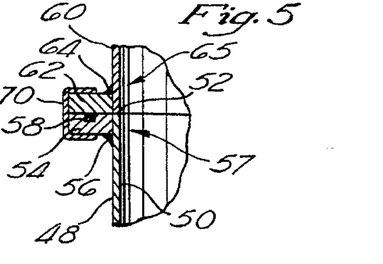
FIG. 5 is a cross-sectional view taken along line 5—5 of FIG. 4.

Referring now to FIGS. 1 and 3–6, the deposition chamber 12 constructed in accordance with the present invention has a tank-like configuration, and comprises a floor 46 which defines the bottom end thereof. In addition to the floor 46, the deposition chamber 12 comprises a cylindrically configured vertical sidewall 48 defining an inner surface 50 of substantially constant diameter and an upper edge 52. As best seen in FIG. 5, attached to the outer surface of the sidewall 48 is an annular connecting ring 54, the upper surface of which is substantially flush with the upper edge 52 of the sidewall 48. Both the sidewall 48 and connecting ring 54 are fabricated from a metal material, with the attachment of the connecting ring 54 to the sidewall 48 preferably being accomplished via a weld 56, though alternative attachment methods may be utilized. Formed within the upper surface of the connecting ring 54 is a continuous channel which accommodates a sealing member such as an O-ring 58. The connecting ring 54 and upper edge 52 define a radially extending flange portion 57. It will be recognized that such flange portion 57 may alternatively be formed as an integral portion of the sidewall 48 rather than by the attachment of the separate connecting ring 54 thereto.

Releasably attached to the flange portion 57 of the sidewall 48 (defined by the upper edge 52 and connecting ring 54) is a cylindrically configured wall extension member 60 having upper and lower edges or rims. Attached to the outer surface of the wall extension member 60 is an annular bottom connecting ring 62, the lower surface of which is substantially flush with the lower rim of the wall extension member 60. Like the attachment of the connecting ring 54 to the sidewall 48, the bottom connecting ring 62 is preferably attached to the outer surface of the wall extension member 60 via a weld 64. The connecting ring 54 and bottom connecting ring 62 are identically sized. However, unlike the connecting ring 54, the bottom connecting ring 52, and in particular the upper and lower surfaces thereof, are devoid of any groove or channel. When attached to the wall extension member 60, the bottom connecting ring 62 and lower rim of the wall extension member 60 define a radially extending lower flange portion 65.

As seen in FIG. 4, also attached to the outer surface of the wall extension member 60 is an annular top connecting ring 66 which is identically sized and configured to the connecting ring 54, and includes a continuous channel 64 formed within the upper surface thereof which accommodates a sealing member such as an O-ring. The upper surface of the top connecting ring 66 is substantially flush with the upper rim of the wall extension member 60. Like the bottom connecting ring 62, the top connecting ring 66 is preferably attached to the outer surface of the wall extension member 50 via a weld. The top connecting ring 66 and upper rim of the wall extension member 60 define a radially extending upper flange portion 67. It will be recognized that the flange portions 65, 67 may alternatively be formed as integral portions of the wall extension member 60.

As best seen in FIGS. 4 and 5, the releasable attachment of the wall extension member 60 to the sidewall 48 is facilitated by initially abutting the flange portion 65 defined by the bottom connecting ring 62 and lower rim of the wall extension member 60 against the flange portion 57 defined by the connecting ring 54 and upper edge 52 of the sidewall 48. Importantly, the thicknesses of the wall extension member 60 and sidewall 48 are substantially equal, as are the widths of the bottom connecting ring 62 and connecting ring 54. As such, when the flange portions 57, 65 are properly abutted against each other, the inner surface 50 of the sidewall 48 is substantially continuous with the inner surface of the wall extension member 60, with the peripheral edge of the connecting ring 54 being substantially flush with the peripheral edge of the bottom connecting ring 62.

Subsequent to the abutment of the flange portions 57, 65 against each other, an annular locking collar 70 having a generally U-shaped cross-sectional configuration is extended over the connecting ring 54 and bottom connecting ring 62 in the manner shown in FIG. 5. Thereafter, the opposed ends of the locking collar 70 are drawn toward each other via a fastener such as a bolt 72 thereby maintaining the wall extension member 60 in rigid attachment to the sidewall 48. Importantly, the O-ring 58 disposed within the connecting ring 54 is sized so as to protrude slightly beyond the upper surface thereof. As such, when the bottom connecting ring 62 is abutted against the connecting ring 54 and maintained thereagainst by the locking collar 70, a fluid-tight seal between the connecting rings 54, 62 and hence the flange portions 57, 65 is created by the O-ring 58. When the wall extension member 60 is attached to the sidewall 48, the flange portion 67 formed by the upper rim of the wall extension member 60 and top connecting ring 66 defines the top end of the deposition chamber 12. Additionally, the wall extension member 60, sidewall 48 and floor 46 cumulatively define an interior compartment 74 of the deposition chamber 12 which, as previously indicated, is sized and configured to accommodate a substrate support rack.

Referring now to FIGS. 3 and 4, the deposition chamber 12 constructed in accordance with the present invention further comprises a tubular vapor inlet port 76 which is attached to the sidewall 48 adjacent the floor 46 and tangentially communicates with the interior compartment 74. In the preferred embodiment, the distance separating the axis of the vapor inlet port 76 from the upper surface of the floor 46 is approximately 1⅜ inches. Though not shown, the end of the vapor inlet port 76 opposite that attached to the sidewall 48 is releasably coupled to a tubular connection extending from the pyrolysis chamber 26. In this respect, monomer vapor flows from the pyrolysis chamber 26 into the deposition chamber 12, and in particular the interior compartment 74 thereof, via the vapor inlet port 76 and the tubular connection extending from the pyrolysis chamber 26 to which the vapor inlet port 76 is releasably connected. As further seen in FIG. 3, the deposition chamber 12 is mounted to the base cabinet 28 of the deposition chamber module 18 in a manner wherein both the floor 46 and vapor inlet port 76 reside within the interior of the base cabinet 28 (i.e., are disposed below the top surface of the base cabinet 28).

As will be recognized, the releasable connection of the vapor inlet port 76 to the tubular connection extending from the pyrolysis chamber 26 allows the vapor generating and deposition chamber modules 16, 18 to be selectively detached from one another in the aforementioned manner. Importantly, in view of the vapor inlet port 76 tangentially communicating with the interior compartment 74, monomer vapor entering the interior compartment 74 therethrough will impinge the inner surface 50 of the sidewall 48 in a manner facilitating flow of the monomer vapor in a generally rotational pattern within the interior compartment 74, as shown in FIG. 3. As further seen in FIG. 3, the rotary vapor flow pattern achieved within the interior compartment 74 travels in an upward, generally counter-clockwise direction. Various studies have established that reactive parylene monomer vapor tends to settle somewhat in the earth's gravitational field, just as predicted by the kinetic theory of gases. In this respect, the vapor density of the parylene monomer vapor tends to increase with depth in the deposition chamber 12. As a result, parylene is generally deposited to greater thicknesses nearer the bottom of the deposition chamber 12 than the top thereof. In the deposition chamber 12, the deposition of parylene in greater concentrations near the floor 46 of the deposition chamber 12 is overcome by having the vapor inlet port 76 attached to the sidewall 48 adjacent the floor 46 such that the monomer vapor flow pattern travels upwardly.

As previously indicated, substrates to be coated in the deposition system 10 are typically stored within a substrate support rack which is positioned within the interior compartment 74. The coating of such substrates is optimized by the upward spiral flow of the monomer vapor within the interior compartment 74, and is further optimized by the rotation of the substrate support rack in a direction opposite that of the monomer vapor (i.e., in a clockwise direction). Such rotation of the substrate support rack is facilitated by the motor 36 disposed within the base cabinet 28 which is mechanically coupled to the substrate support rack via a coupling member 77 rotatably connected to the lower surface of the floor 46.

In addition to the vapor inlet port 76, the deposition chamber 12 includes a first vapor outlet port 78 which is attached to the sidewall 48 adjacent the flange portion 57, and a second vapor outlet port 80 which is attached to the wall extension member 60 adjacent the flange portion 67. In the preferred embodiment, the distance separating the axis of the first vapor outlet port 78 from the connecting ring 54 is approximately 1⅜ inches, as is the distance separating the axis of the second vapor outlet port 80 from the top connecting ring 66. Like the vapor inlet port 76, the first and second vapor outlet ports 78, 80 each tangentially communicate with the interior compartment 74 of the deposition chamber 12. Such tangential communication aids in maintaining the spiral vapor flow pattern within the interior compartment 74.

Figure 6:
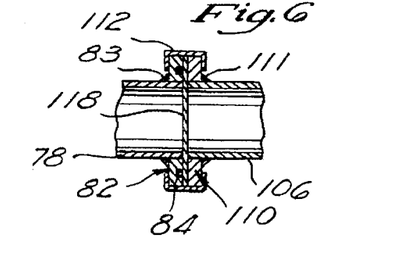
FIG. 6 is a cross-sectional view taken along line 6—6 of FIG. 4.

The first and second vapor outlet ports 78, 80 are identically configured, and each include a radially extending flange portion 82 formed on the distal end thereof. As seen in FIG. 6, the flange portion 82 of the first vapor outlet port 78 is preferably formed by the attachment of a separate, annular attachment ring to the outer surface of the first vapor outlet port 78 via a weld 83 in a manner wherein the outer surface of the attachment ring circumvents and is substantially flush with the end of the first vapor outlet port 78 opposite that attached to the sidewall 48. The flange portion 82 included on the second vapor outlet port 80 is formed in an identical manner, i.e., by the attachment of a separate, annular attachment ring to the outer surface of the second vapor outlet port 80. However, it will be recognized that the first and second vapor outlet ports 78, 80 may alternatively be formed to include the flange portions 82 as integral portions thereof. As also seen in FIG. 6, each flange portion 82, and in particular the attachment ring used to define the same, preferably includes a continuous groove or channel formed in the outer surface thereof which accommodates a sealing member such as an O-ring 84. In the preferred embodiment, the wall extension member 60 is attached to the sidewall 48 in a manner wherein the first and second vapor outlet ports 78, 80 extend in generally parallel relation to each other, as seen in FIGS. 1, 3 and 4.

In the parylene deposition system 10, the deposition chamber 12 is used in combination with the cold trap 14 which itself comprises an elongate containment vessel 86 having a closed bottom end and an open top end defined by an annular flange portion or lip 88 which extends radially outward relative to the remainder of the containment vessel 86. Disposed within the upper surface of the lip 88 is a continuous groove or channel 90 which accommodates a sealing member such an O-ring. As seen in FIG. 3, the lower half of the containment vessel 86 resides within the base cabinet 28, with a tubular connection 34 being used to facilitate the fluid coupling of the bottom end of the containment vessel 86 to the filter 30.

Releasably attached to the containment vessel 86, and in particular to the lip 88 thereof, is a tubular extension sleeve 92 which includes a bottom flange portion 94 extending radially outward from the lower end thereof and a top flange portion 96 extending radially outward from the upper end thereof. The bottom and top flange portions 94, 96 and lip 88 are identically sized, with the top flange portion 96, like the annular lip 88, including a continuous groove or channel 98 formed in the upper surface thereof which accommodates a sealing member such as an O-ring. In the preferred embodiment, the containment vessel 86 (excluding the lip 88) and the extension sleeve 92 (excluding the flange portions 94, 96) are each cylindrically configured and of substantially equal diameter and wall thickness.

As seen in FIGS. 1 and 3, the releasable attachment of the extension sleeve 92 to the containment vessel 86 is facilitated by initially abutting the bottom flange portion 94 against the lip 88. Since the thicknesses of the cylindrical walls of the containment vessel 86 and extension sleeve 92 are substantially equal, when the lip 88 and bottom flange portion 94 are properly abutted against each other, the inner surface of the extension sleeve 92 is substantially continuous with the inner surface of the containment vessel 86. Additionally, the peripheral edge of the lip 88 is substantially flush with the peripheral edge of the bottom flange portion 94.

Subsequent to the abutment of the bottom flange portion 94 against the lip 88, an annular locking collar 100 similar to the locking collar 70 but smaller in diameter is extended over the lip 88 and bottom flange portion 94 in the manner shown in FIG. 1. Thereafter, the opposed ends of the locking collar 100 are drawn toward each other via a fastener such as a bolt 102, thereby maintaining the extension sleeve 92 in rigid attachment to the containment vessel 86. The O-ring disposed within the channel 90 of the lip 88 is sized so as to protrude slightly beyond the upper surface thereof. As such, when the bottom flange portion 94 is abutted against the lip 88 and maintained thereagainst by the locking collar 100, a fluid-tight seal between the lip 88 and bottom flange portion 94 is created by the O-ring. When attached to each other, the extension sleeve 92 and containment vessel 86 cumulatively define an interior reservoir of the cold trap 14.

Attached to the containment vessel 86 adjacent the lip 88 is a first vapor inlet line 106, while attached to the extension sleeve 92 adjacent the top flange portion 96 is a second vapor inlet line 108. The first and second vapor inlet lines 106, 108 each tangentially communicate with the interior reservoir of the cold trap 14 when the containment vessel 86 and extension sleeve 92 are releasably attached to each other. As seen in FIGS. 1–3, the extension sleeve 92 is preferably attached to the containment vessel 86 in a manner wherein the first and second vapor inlet lines 106, 108 extend in substantially parallel relation to each other. Additionally, the first and second vapor inlet lines 106, 108 each include a flange portion 110 extending radially outwardly from the distal end thereof. The flange portions 110 included on the first and second vapor inlet lines 106, 108 are identically sized to the flange portions 82 included on the first and second vapor outlet ports 78, 80.

As seen in FIG. 6, the flange portion 110 is formed on the first vapor inlet line 106 by the attachment of a separate, annular attachment ring to the outer surface thereof via a weld 111 in a manner wherein the outer surface of the attachment ring circumvents and is substantially flush with the end of the first vapor inlet line 106 opposite that attached to the extension sleeve 92. The flange portion 110 of the second vapor inlet line 108 is formed in an identical manner, i.e., by the attachment of a separate, annular attachment ring to the outer surface of the second vapor inlet line 108. However, it will be recognized that the first and second vapor inlet lines 106, 108 may each be formed to include the flange portions 110 as integral portions thereof.

In the parylene deposition system 10 of the present invention, the deposition chamber 12 need not include the wall extension member 60 attached to the sidewall 48. In this respect, the wall extension member 60 is only attached to the sidewall 48 when it is desired to increase the storage capacity of the deposition chamber 12 so as to allow the same to accommodate a substrate support fixture of larger size. When the deposition chamber 12 does not include the wall extension member 60, the cold trap 14 will not include the extension sleeve 92.

When neither the wall extension member 60 or extension sleeve 92 are included with the deposition chamber 12 and cold trap 14, respectively, the first vapor outlet port 78 is fluidly connected to the first vapor inlet line 106, thereby creating a monomer vapor flow path from the deposition chamber 12 into the cold trap 14. Such fluid connection is facilitated by the abutment of the flange portion 82 of the first vapor outlet port 78 against the flange portion 110 of the first vapor inlet line 106. Since the flange portions 82, 110 are identically sized, the peripheral edges thereof are substantially flush when the flange portions 82, 110 are abutted against each other. Thereafter, an annular locking collar 112 which is similarly configured to the previously described locking collars 70, 100 but is smaller in diameter is extended over the flange portions 82, 110, with the opposed ends thereof being drawn toward each other via a fastener such as a bolt 114 so as to maintain the first vapor outlet port 78 and first vapor inlet line in rigid attachment to each other. Importantly, the O-ring 84 included in the flange portion 82 of the first vapor outlet port 78 is sized so as protrude slightly beyond the outer surface thereof. As such, when the flange portion 110 of the first vapor inlet line 106 is abutted against the flange portion 82 of the first vapor outlet port 78, a fluid-tight seal is created by the O-ring 84. The attachment of the first vapor outlet port 78 and first vapor inlet line 106 to each other is illustrated in FIG. 6.

As previously explained, the wall extension member 60 is attached to the sidewall 48 when it is desired to increase the storage capacity of the deposition chamber 12. When the wall extension member 60 is attached to the sidewall 48, the extension sleeve 92 is attached to the containment vessel 86. Thereafter, the second vapor outlet port 80 of the deposition chamber 12 is fluidly connected to the second vapor inlet line 108 of the cold trap 14 in the same manner as previously described in relation to the attachment of the first vapor outlet port 78 to the first vapor inlet line 106. In this respect, the flange portions 82, 110 of the second vapor outlet port 80 and second vapor inlet line 108 are abutted against each other, and maintained in firm attachment to each other via the extension of an annular locking collar 116 thereabout which is identically configured to the locking collar 112.

When the second vapor outlet port 80 is coupled to the second vapor inlet line 108, it is desirable to block the flow of monomer vapor from the deposition chamber 12 into the cold trap 14 via the first vapor outlet port 78 and first vapor inlet line 106 which, prior to the addition of the wall extension member 60 and extension sleeve 92, are fluidly connected to each other. As seen in FIG. 6, such blockage is facilitated by removing the locking collar 112 from the flange portions 82, 110 of the first vapor outlet port 78 and first vapor inlet line 106, and inserting a circularly configured disc member 118 therebetween. Subsequent to the placement of the disc member 118 between the flange portions 82, 110 of the first vapor outlet port 78 and first vapor inlet line 106, the locking collar 112 is re-applied thereto. As will be recognized, the disc member 118 effectively prevents the flow of monomer vapor through the first vapor outlet port 78 into the first vapor inlet line 106. Importantly, the monomer vapor flow path defined by the first vapor outlet port 78 and first vapor inlet line 106 must be blocked when the wall extension member 60 and extension sleeve 92 are included with the deposition chamber 12 and cold trap 14 so as to insure that all of the substrates within the deposition chamber 12 are adequately coated. In this respect, optimal coating of the substrates occurs when the monomer vapor exits the deposition chamber 12 as closely as possible to the top end thereof.

In the operation of the parylene deposition system 10, a quantity of parylene dimer is initially introduced into the vaporization chamber 24 via its entrance port. After such introduction has occurred, the deposition process is initiated by activating the heating elements associated with the pyrolysis chamber 26, the motor 36 and the vacuum pump 32. The heating elements of the pyrolysis chamber 26 are set to an operating temperature of 400°–700° C., and preferably about 600° C. When the set temperature of the heating elements of the pyrolysis chamber 26 have been reached and the required vacuum has been achieved by the vacuum pump 32, the heating elements of the vaporization chamber 24 are activated to start the process of sublimation of the dimer.

The activation of the vacuum pump 32 creates a negative system pressure which causes the parylene material to be drawn from the vaporization chamber 24 into the pyrolysis chamber 26 via the tubular connections therebetween. As the vaporized dimer enters the pyrolysis chamber 26, the heat provided by the heating elements associated therewith causes the dimer to be further pyrolyzed to form the desired para-xylylene-monomer. The vacuum created by the vacuum pump 32 causes the parylene vapor to be drawn into the interior compartment 74 of the deposition chamber 12 via the vapor inlet port 76. The vapor flows rotationally, axially upwardly through the deposition chamber 12 and condenses, i.e., deposits, upon substrate articles positioned within the deposition chamber 12, and in particular within the substrate support rack or fixture within the interior compartment 74. As previously explained, during the coating process, the substrate support fixture is rotated in a direction opposite the vapor flow path by the motor 36.

Any residual vapor exists the deposition chamber 12 via the second vapor outlet port 80 (since the first vapor outlet port 78 is effectively blocked). After passing through the second vapor outlet port 80 and second vapor inlet line 108, the vapor enters and circulates through the interior reservoir of the cold trap 14. The flow through the cold trap 14 causes the condensation and polymerization of residual vapors which were not coated upon the substrates disposed upon the fixture rack within the deposition chamber 12. The vapor is then drawn from within the interior reservoir of the cold trap 14 through the tubular connection 34 and into the filter 30 wherein any remaining vapor is removed from the airstream. In this respect, the filter 30 prevents any parylene from condensing within the vacuum pump 32. Thereafter, the airstream is circulated through the vacuum pump 32 and subsequently vented to the exterior of the base cabinet 28 of the deposition chamber module 18.

Referring now to FIG. 1, the deposition chamber 12 may further be provided with a second wall extension member 120 which is releasably attached to the upper flange portion 67 of the wall extension member 60 in the same manner that the lower flange portion 65 of the wall extension member 60 is releasably attached to the flange portion 57 of the sidewall 48. In this respect, the lower flange portion of the second wall extension member 120 is sized and configured identically to the lower flange portion 65 of the wall extension member 60, and is maintained in engagement to the upper flange portion 67 via an annular locking collar 122 which is identical to the locking collar 70. Since, like the flange portion 57 of the sidewall 48, the upper flange portion 67 of the wall extension member 60 includes the O-ring within the channel 68, a fluid-tight seal is created between the upper flange portion 67 and the lower flange portion of the second wall extension member 120 when engaged to each other via the locking collar 122.

The second wall extension member 120 further includes an upper flange portion 124 which is sized and configured identically to the upper flange portion 67 and, when the second wall extension member 120 is releasably attached to the wall extension member 60, defines the top end of the deposition chamber 12. The diameters and wall thicknesses of the wall extension members 60, 120 are substantially equal, as are the sizes of their upper and lower flange portions. Additionally, the interior compartment member 74 of the deposition chamber 12 is defined by the wall extension members 60, 120 and sidewall 48 when both wall extension members are included with the deposition chamber 12.

Attached to the second wall extension member 120 and tangentially communicating with the interior compartment 74 is a third vapor outlet port 128 which is identically configured to the first and second vapor outlet ports 78, 80, and includes a radially extending flange portion disposed on the end thereof opposite that attached to the second wall extension member 120. As seen in FIG. 1, the second wall extension member 120 is attached to the wall extension member 60 in a manner wherein the third vapor outlet port 128 extends in generally parallel relation to the first and second vapor outlet ports 78, 80.

When the second wall extension member 120 is included with the deposition chamber 12, a second tubular extension sleeve 130 is included with the cold trap 14, and attached to the top flange portion 96 of the extension sleeve 92. The second extension sleeve 130 includes a bottom flange portion which is sized and configured identically to the bottom flange portion 94 of the extension sleeve 92, and a top flange portion 132 which is sized and configured identically to the top flange portion 96 of the extension sleeve 92, i.e., includes a continuous groove or channel formed in the upper surface thereof for accommodating a sealing member such an O-ring. Additionally, the diameters and wall thicknesses of the extension sleeves 92, 130 are substantially equal. The releasable attachment of the second extension sleeve 130 to the extension sleeve 92 is facilitated in the same manner as the releasable attachment of the extension sleeve 92 to the containment vessel 86. In this respect, the bottom flange portion of the second extension sleeve 130 and the top flange portion 96 of the extension sleeve 92, after being abutted against each other, are maintained in sealed engagement by an annular locking collar 134 which is identical to the locking collar 100. When the second extension sleeve 130 is included with the cold trap 14, the interior reservoir thereof is defined by the extension sleeves 92, 130 and the containment vessel 86.

Attached to the second extension sleeve 130 and tangentially communicating with the interior reservoir of the cold trap 14 is a third vapor inlet line 136 which is configured identically to the first and second vapor inlet lines 106, 108 and includes a radially extending flange portion. The second extension sleeve 130 is attached to the extension sleeve 92 in a manner wherein the third vapor inlet line 136 extends in generally parallel relation to the first and second vapor inlet lines 106, 108. When the second wall extension member 120 is included with the deposition chamber 12 and the second extension sleeve 130 with the cold trap 14, the third vapor outlet port 128 is fluidly connected to the third vapor inlet line 136 in the same manner as previously described in relation to the fluid connection of the second vapor outlet port 80 to the second vapor inlet line 108. In this respect, the flange portions included on the distal ends of the third vapor outlet port 128 and third vapor inlet line 136 are maintained in sealed engagement to each other via an annular locking collar 138 which is configured identically to the locking collars 112, 116.

As will be recognized, when the third vapor outlet port 128 is fluidly connected to the third vapor inlet line 136, a second disc member 118 will be placed between the flange portions 82, 110 of the second vapor outlet port 80 and second vapor inlet line 108 in the same manner the first disc member 118 is placed between the flange portions 82, 110 of the first vapor outlet port 78 and first vapor inlet line 106. As such, the sole flow path of the monomer vapor exiting the interior compartment 74 of the deposition chamber 12 and entering the interior reservoir of the cold trap 14 will be through the fluidly connected third vapor outlet port 128 and third vapor inlet line 136.

Though not shown, it will be recognized that a lid member is normally attached to the upper flange portion of the uppermost wall extension member included in the deposition chamber 12 to enclose the interior compartment 74 thereof. In the event no wall extension members are included, such lid member is engaged in a sealed manner to the flange portion 57 of the sidewall 48. Since the upper flange portions 57, 67 and 124 of the sidewall 48 and wall extension members 60, 120 each include an O-ring in the upper surfaces thereof, a fluid-tight seal is always maintained between the lid member and the particular flange portion to which it is attached. Though also not shown, the cold trap 14 is adapted to accommodate a cooling member which is filled with a material such as liquid nitrogen, carbon dioxide or helium, and is sealed against the annular lip 88 of the containment vessel 86 if either of the extension sleeves 92, 120 is not included, or is alternatively sealed against the top flange portion of the uppermost extension sleeve.

As best seen in FIG. 3, the deposition chamber 12 and cold trap 14 are mounted within the base cabinet 28 of the deposition chamber module 18 in a manner wherein the upper surface of the flange portion 57 of the sidewall 48 and the upper surface of the lip 88 of the containment vessel 86 extend in substantially co-planar relation to each other. Additionally, the first vapor outlet port 78 and first vapor inlet 106 are oriented so as to be coaxially aligned with each other to facilitate the abutment of the flange portions 82, 110 against each other in the aforementioned manner.

The wall extension members 60, 120 which may be included with the deposition chamber 12 are preferably fabricated having a height of from 6 to 18 inches. As seen in FIG. 1, the height of the wall extension member 60 exceeds that of the second wall extension member 120. In accordance with the present invention, one or more wall extension members of identical or differing heights may be attached to the sidewall 48 in any sequence, depending on the desired internal storage capacity of the overall deposition chamber 12.

Like the wall extension members 60, 120, the extension sleeves 92, 130 are preferably fabricated having an overall height of from 6 to 18 inches. As will be recognized, wall extension members and extension sleeves of identical height are preferably attached to the sidewall 48 and containment vessel 86 in the same sequence so that the upper surfaces of the upper flange portions thereof extend in substantially co-planar relation to each other. In this respect, for wall extension members and extension sleeves of identical height, the vapor outlet ports and vapor inlet lines are oriented thereon so as to be in co-axial alignment with each other when the wall extension members and extension sleeves are attached to the sidewall 48 and containment vessel 46 in the proper sequence. As previously indicated, any number of wall extension members and extension sleeves may be included with the deposition chamber 12 and cold trap 14. Advantageously, the wall extension members and extension sleeves allow the storage capacity of the deposition chamber 12 to be selectively increased or decreased as needed to conduct a desired parylene coating operation.

Additional modifications and improvements of the present invention may also be apparent to those skilled in the art. Thus, the particular combination of parts described and illustrated herein is intended to represent only certain embodiments of the present invention, and is not intended to serve as limitations of alternative devices within the spirit and scope of the invention.

What is claimed is:

1. A deposition chamber for use in depositing vapors on substrates, said deposition chamber having top and bottom ends and comprising:

a floor which defines the bottom end of the deposition chamber;

a vertical sidewall having an inner surface and an upper edge;

at least one wall extension member releasably attached to the upper edge and having an upper rim which defines the top end of the deposition chamber, said wall extension member, said sidewall and said floor defining an interior compartment;

a vapor inlet port attached to said sidewall and communicating with said interior compartment;

a first vapor outlet port attached to said sidewall and communicating with said interior compartment; and a second vapor outlet port attached to said wall extension member and communicating with said interior compartment;

wherein said wall extension member increases the storage capacity of the deposition chamber when attached to the upper edge of the sidewall.

2. The deposition chamber of claim 1 wherein said sidewall and said wall extension member each have generally cylindrical configurations.

3. The deposition chamber of claim 1 wherein said vapor inlet port is attached to said sidewall adjacent said floor, said first vapor outlet port is attached to said sidewall adjacent said upper edge, and said second vapor outlet port is attached to said wall extension member adjacent said upper rim.

4. The deposition chamber of claim 3 wherein said vapor inlet port tangentially communicates with said interior compartment such that vapor entering the interior compartment therethrough will impinge the inner surface of the sidewall in a manner facilitating flow in a generally rotational pattern within the interior compartment.

5. The deposition chamber of claim 4 wherein said first and second vapor outlet ports each tangentially communicate with the interior compartment.

6. The deposition chamber of claim 1 further in combination with a cold trap comprising:

a containment vessel having a closed bottom end and an open top end defined by an annular lip;

at least one tubular extension sleeve releasably attached to said annular lip, said containment vessel and said extension sleeve defining an interior reservoir;

a first vapor inlet line attached to said containment vessel and communicating with said interior reservoir; and a second vapor inlet line attached to said extension sleeve and communicating with said interior reservoir;

said first vapor inlet line being fluidly connectible to said first vapor outlet port and said second vapor inlet line being fluidly connected to said second vapor outlet port.

7. The deposition chamber of claim 6 wherein said first and second vapor inlet lines each tangentially communicate with the interior reservoir of the cold trap.

8. A deposition chamber for use in depositing vapors on substrates, said deposition chamber having top and bottom ends and comprising:

a floor which defines the bottom end of the deposition chamber;

a vertical sidewall having an inner surface and an upper edge;

a first wall extension member releasably attached to the upper edge of the sidewall and having a first upper rim;

a second wall extension member releasably attached to the upper rim of the first wall extension member and having a second upper rim which defines the top end of the deposition chamber, said first and second wall extension members, said side wall, and said floor defining an interior compartment;

a vapor inlet port attached to said sidewall and communicating with said interior compartment;

a first vapor outlet port attached to said sidewall and communicating with said interior compartment;

a second vapor outlet port attached to said first wall extension member and communicating with said interior compartment; and a third vapor outlet port attached to said second wall extension member and communicating with said interior compartment;

wherein said first and second wall extension members increase the storage capacity of the deposition chamber when attached to the upper edge of the sidewall.

9. The deposition chamber of claim 8 wherein said sidewall and said first and second wall extension members each have generally cylindrical configurations.

10. The deposition chamber of claim 8 wherein said vapor inlet port is attached to said sidewall adjacent said floor, said first vapor outlet port is attached to said sidewall adjacent said upper edge, said second vapor outlet port is attached to said first wall extension member adjacent said first upper rim, and said third vapor outlet port is attached to said second wall extension member adjacent said second upper rim.

11. The deposition chamber of claim 10 wherein said vapor inlet port tangentially communicates with said interior compartment such that vapor entering the interior compartment therethrough will impinge the inner surface of the sidewall in a manner facilitating flow in a generally rotational pattern within the interior compartment.

12. The deposition chamber of claim 11 wherein said first, second and third vapor outlet ports each tangentially communicate with the interior compartment.

13. The deposition chamber of claim 8 further in combination with a cold trap comprising:

a containment vessel having a closed bottom end and a open top end defined by an annular lip;

a first tubular extension sleeve releasably attached to the annular lip of the containment vessel;

a second tubular extension sleeve releasably attached to the first tubular extension sleeve, said containment vessel and said first and second tubular extension sleeves defining an interior reservoir of the cold trap;

a first vapor inlet line attached to said containment vessel and communicating with said interior reservoir;

a second vapor inlet line attached to said first extension sleeve and communicating with said interior reservoir; and a third vapor inlet line attached to said second extension sleeve and communicating with said interior reservoir;

said first vapor inlet line being fluidly connectible to said first vapor outlet port, said second vapor inlet line being fluidly connectible to said second vapor outlet port, and said third vapor inlet line being fluidly connected to said third vapor outlet port.

14. The deposition chamber of claim 13 wherein said first, second and third vapor inlet lines each tangentially communicate with the interior reservoir of the cold trap.

* * * * *